United States Patent
Marume et al.

(10) Patent No.: US 6,593,154 B2
(45) Date of Patent: Jul. 15, 2003

(54) APPARATUS AND METHOD FOR CONTROLLING SEMICONDUCTOR MANUFACTURING SYSTEM UTILIZING RECYCLED WAFERS

(75) Inventors: Yasuhiro Marume, Hyogo (JP); Toshiyuki Watanabe, Hyogo (JP); Masaki Otani, Hyogo (JP); Takamasa Inobe, Hyogo (JP); Yasuhiro Sato, Hyogo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 10/095,040

(22) Filed: Mar. 12, 2002

(65) Prior Publication Data
US 2003/0009256 A1 Jan. 9, 2003

(30) Foreign Application Priority Data
Jul. 6, 2001 (JP) ........................ 2001-206275

(51) Int. Cl.$^7$ ............................. H01L 21/66
(52) U.S. Cl. ......................... 438/14; 118/678
(58) Field of Search ............... 438/14, 15, 16, 438/692; 356/394; 700/121, 100, 112; 118/678

(56) References Cited

U.S. PATENT DOCUMENTS

| | | | |
|---|---|---|---|
| 5,867,388 A | * | 2/1999 | Okumura et al. ............ 700/112 |
| 5,930,137 A | * | 7/1999 | Togashi ...................... 700/100 |
| 5,976,199 A | * | 11/1999 | Wu et al. .................... 29/25.01 |
| 6,076,652 A | * | 6/2000 | Head, III ................. 198/341.07 |
| 6,096,567 A | * | 8/2000 | Kaplan et al. ................. 438/14 |
| 6,121,147 A | * | 9/2000 | Daniel et al. ................ 438/692 |
| 6,148,246 A | * | 11/2000 | Kawazome .................. 700/121 |
| 6,242,270 B1 | * | 6/2001 | Nagaswami et al. .......... 438/14 |
| 6,397,119 B1 | * | 5/2002 | Marume et al. ............ 700/121 |
| 6,404,498 B1 | * | 6/2002 | Maeda et al. ................ 356/394 |
| 6,466,882 B1 | * | 10/2002 | Kang et al. .................... 702/84 |

FOREIGN PATENT DOCUMENTS

JP 10-321486 12/1998

OTHER PUBLICATIONS

U.S. patent application Ser. No. 09/354,094, "Semiconductor Manufacturing System For Simultaneous Processing Of Prescribed Number Of Lots" Yasuhiro Marume, et al, Filed Jul. 15, 1999.

* cited by examiner

Primary Examiner—John F. Niebling
Assistant Examiner—Olivia Luk
(74) Attorney, Agent, or Firm—McDermott, Will & Emery

(57) ABSTRACT

A method of process control includes the steps of preparing recycling procedure data for each type of film formed on a wafer by diffusion processing, setting a recycle control number for controlling recycling processing based on the recycling procedure data, and outputting a recycling instruction to the recycling apparatus when the prescribed number of non-product wafers are accumulated and when an accept request is received from the recycling apparatus.

12 Claims, 10 Drawing Sheets

F I G. 5

| DIFFUSION APPARATUS | TYPE OF DIFFUSION PROCESSING | TYPE OF DUMMY WAFER | TYPE OF MONITOR WAFER |
|---|---|---|---|
| FIRST DIFFUSION APPARATUS | "OXIDE FILM TREATMENT" | "A1" | "A2" |
| SECOND DIFFUSION APPARATUS | | | |
| THIRD DIFFUSION APPARATUS | | | |
| FOURTH DIFFUSION APPARATUS | | | |
| FIFTH DIFFUSION APPARATUS | | | |
| SIXTH DIFFUSION APPARATUS | "NITRIDE FILM TREATMENT" | "B1" | "B2" |
| SEVENTH DIFFUSION APPARATUS | | | |
| EIGHTH DIFFUSION APPARATUS | | | |
| NINTH DIFFUSION APPARATUS | | | |
| TENTH DIFFUSION APPARATUS | | | |
| ELEVENTH DIFFUSION APPARATUS | "H2 SINTER TREATMENT" | "C1" | "C2" |
| TWELFTH DIFFUSION APPARATUS | | | |
| THIRTEENTH DIFFUSION APPARATUS | | | |
| FOURTEENTH DIFFUSION APPARATUS | | | |
| FIFTEENTH DIFFUSION APPARATUS | | | |
| ... | | | |

F I G. 6

| | TYPE OF DUMMY WAFER | | | | TYPE OF MONITOR WAFER | | | |
|---|---|---|---|---|---|---|---|---|
| | "A1" | "B1" | "C1" | ... | "A2" | "B2" | "C2" | ... |
| PROCEDURE OF RECYCLING STEPS | "STEP A" | "STEP E" | "STEP J" | ... | "STEP N" | "STEP R" | "STEP V" | ... |
| | "STEP B" | "STEP F" | "STEP K" | ... | "STEP O" | "STEP S" | "STEP W" | ... |
| | "STEP C" | "STEP G" | "STEP L" | ... | "STEP P" | "STEP T" | "STEP X" | ... |
| | "STEP D" | "STEP H" | "STEP M" | ... | "STEP Q" | "STEP U" | "STEP Y" | ... |
| | ... | ... | ... | | ... | ... | ... | |

F I G. 7

| RETRIEVAL STOCKING UNIT | | | | PREPARATION STOCKING UNIT | | | |
|---|---|---|---|---|---|---|---|
| "S1" | "S2" | "S3" | ... | "T1" | "T2" | "T3" | ... |
| "A1" 25 | "B1" 5 | "C1" 25 | ... | "A1" 50 | "B1" 25 | "C1" 50 | ... |
| "A1" 20 | "B2" 20 | "C1" 15 | ... | "A1" 25 | "B1" 20 | "C1" 20 | ... |
| "A1" 15 | ... | "C2" 50 | ... | "A2" 15 | "B2" 15 | "C2" 5 | ... |
| "A2" 20 | ... | ... | ... | "A2" 10 | "B2" 10 | "C2" 5 | ... |
| ... | ... | ... | ... | ... | ... | ... | ... |

APPARATUS AND METHOD FOR CONTROLLING SEMICONDUCTOR MANUFACTURING SYSTEM UTILIZING RECYCLED WAFERS

BACKGROUND OF THE INVENTION

1. Field of the Invention

The present invention relates to a process control technique in a semiconductor manufacturing system, and more specifically, to a process control technique that includes an apparatus for processing a prescribed number of wafers at once.

2. Description of the Background Art

A manufacturing process of semiconductor devices includes a diffusion step which is one of the steps in which a prescribed number of wafers are processed at once. In the diffusion step, a diffusion layer including impurities is formed on a wafer. In this step, a prescribed number of wafers that have the same processing condition (such as type of a diffusion film to be formed) are processed at the same time. When the processing in the diffusion step is completed, the wafers are provided to the next step (for instance, a photolithography step for transferring a pattern thereon, a chemical treatment step and the like).

In the diffusion step, in addition to product wafers, monitor wafers and dummy wafers are processed at the same time. Monitor wafers are wafers for inspection of diffusion processing. Measurement of a film thickness and the like of monitor wafers after diffusion processing are performed by a prescribed inspecting apparatus. Dummy wafers are used when the number of product wafers in the diffusion step is smaller than the prescribed number. This is to allow uniform processing in a diffusion furnace. These monitor wafers and dummy wafers are referred to as non-product wafers. These non-product wafers have their diffusion layers, which are formed in the diffusion step, processed by chemicals and the like and thus are restored to the condition before the diffusion processing. The recycled non-product wafers are once again processed in the diffusion step. This recycling processing is performed in a chemical treatment step that also processes the product wafers.

Japanese Patent Laying-Open No. 10-321486 discloses a control apparatus for controlling processing including reproduction or recycling and disposal of such non-product wafers. The control apparatus disclosed in this publication is an apparatus for controlling diffusion processing, reproduction processing, disposal processing and the like of the non-product wafers in a semiconductor manufacturing system. The control apparatus includes an ID (identification) marking circuit for marking on a non-product wafer a wafer ID which includes identifying information and type of the non-product wafer; a storage circuit for storing, for each wafer ID, discrete information including information on number of times the non-product wafer has been recycled and the period of use of the non-product wafer; a master information storage circuit for storing, for each type of the non-product wafer, master information including information on the limit of number of times of recycle, the service life limit, and recycling procedure; an ID reading circuit for reading the wafer ID; a determining circuit for determining on one of reproduction processing and disposal processing based on master information and discrete information of the wafer ID read by the ID reading circuit; and a control circuit for issuing a recycling procedure instruction corresponding to the wafer ID when the result of determination is reproduction processing, and for instructing to reject the non-product wafer corresponding to the wafer ID and rejecting the wafer ID included in the discrete information when the result of determination is disposal processing.

According to this control apparatus, marking of a wafer ID, reading of the wafer ID, and the determination based on the master information and the discrete information of the read wafer ID are automatically performed. As a result, accidents in reproduction processing can be prevented due to elimination of mistakes made by an operator, and reduction in the quantity of non-product wafers used can be achieved by controlling the non-product wafers in a unified manner.

In some cases, mere issuing of the recycling procedure instruction may not bring about the actual recycling processing of the non-product wafers. When the recycling processing is not performed while the quantity of non-product wafers used is being reduced, a shortage of dummy wafers or monitor wafers would take place. In this case, even when the product wafers are made ready for the processing, the non-product wafers cannot be made ready so that processing such as in the diffusion step cannot be performed. In particular, such a problem occurs when the recycling processing is performed in the chemical treatment step for processing the product wafers, because, in the chemical treatment step, the processing of the product wafers is put before the recycling processing of the non-product wafers even when there is a recycling procedure instruction.

SUMMARY OF THE INVENTION

An object of the present invention is to provide a process control apparatus and a method that allow preparation of non-product wafers with high efficiency in a semiconductor manufacturing process.

Another object of the present invention is to provide a process control apparatus and a method that allow preparation of non-product wafers with certainty in a semiconductor manufacturing process.

A further object of the present invention is to provide a process control apparatus and a method that can improve an availability ratio of a processing step for processing product wafers in a semiconductor manufacturing process.

A still further object of the present invention is to provide a process control apparatus and a method that allow control of non-product wafers with high efficiency in a semiconductor manufacturing process.

A process control apparatus according to the present invention controls a semiconductor manufacturing system including a processing apparatus for batch-processing a prescribed number of wafers at once and a recycling apparatus for recycling wafers processed by the processing apparatus. The processing apparatus processes the wafers based on a predetermined processing condition. The prescribed number of wafers include product wafers and non-product wafers. The recycling apparatus recycles the non-product wafers. The recycled wafers are repeatedly processed by the processing apparatus. The process control apparatus includes a communication circuit for communicating with the processing apparatus and the recycling apparatus, a storage circuit for storing recycling processing procedure corresponding to the processing condition, a detection circuit connected to the communication circuit for detecting non-product wafers included in the processed wafers when the batch-processing by the processing apparatus is completed, and an instructing circuit connected to the communication circuit, the storage circuit, and the detection circuit for instructing the recycling apparatus to perform recycling processing on the detected non-product wafers based on the recycling processing procedure corresponding to the processing condition that was used when the non-product wafers were processed by the processing apparatus.

The non-product wafers are recycled in the recycling apparatus by an instruction from the process control apparatus to the recycling apparatus. Even in the case where the recycling processing procedures differ due to the processing conditions in the processing apparatus, the preparation of the non-product wafers prior to the next processing in the processing apparatus can be ensured. As a result, a process control apparatus in a semiconductor manufacturing system can be provided which can improve the availability ratio of a processing step for processing the product wafers by preparing the non-product wafers with high efficiency and certainty.

More preferably, the process control apparatus includes a counting circuit for counting a number of times the non-product wafers are processed by the processing apparatus, and a control circuit connected to the detection circuit and the counting circuit for controlling the instructing circuit to interrupt the instruction when a number of times the detected non-product wafers are processed exceeds a predetermined number of times.

The number of times the non-product wafers are processed are counted, and when it exceeds a predetermined number of times, the recycling processing can be interrupted so as not to allow recycled use. Thus, excessive recycling can be prevented.

More preferably, the recycling apparatus batch-processes a prescribed number of wafers at once. The semiconductor manufacturing system further includes a stocking unit disposed between the processing apparatus and the recycling apparatus. The stocking unit stocks a prescribed number wafers required for processing in the recycling apparatus. The communication circuit includes a circuit for communicating with the stocking unit as well as with the processing apparatus and the recycling apparatus. The process control apparatus further includes a stocking unit control circuit connected to the communication circuit for controlling the stocking unit to discharge the non-product wafers to the recycling apparatus from the stocking unit when a prescribed number of the non-product wafers required for processing in the recycling apparatus are stocked.

The prescribed number of non-product wafers required for processing in the recycling apparatus are stocked before being supplied into the recycling apparatus. The prescribed number of wafers are supplied each time to the recycling apparatus so that the availability ratio of the recycling apparatus can be improved, and the non-product wafers can be prepared prior to the processing that succeeds the diffusion processing step.

More preferably, the process control apparatus further includes a reception circuit connected to the communication circuit for receiving an accept request from the recycling apparatus. The stocking unit control circuit includes a circuit for controlling the stocking unit to discharge the non-product wafers to the recycling apparatus from the stocking unit when the prescribed number of non-product wafer required for processing in the recycling apparatus are stocked and when the reception circuit receives the accept request from the recycling apparatus.

Even if the recycling apparatus also performs the processing for the product wafers, the non-product wafers can be supplied into the recycling apparatus based on the accept request from the recycling apparatus. Thus, the availability ratio of the recycling apparatus can be improved, and the non-product wafers can be prepared prior to the processing that succeeds the diffusion processing step.

A method of process control according to another aspect of the present invention controls a semiconductor manufacturing system that includes a processing apparatus for batch-processing a prescribed number of wafers at once and a recycling apparatus for recycling wafers processed by the processing apparatus. The processing apparatus processes the wafers based on a predetermined processing condition. The prescribed number of wafers include product wafers and non-product wafers. The recycling apparatus recycles the non-product wafers. The recycled wafers are repeatedly processed by the processing apparatus. The method of process control includes the steps of preparing recycling processing procedure corresponding to the processing condition, detecting non-product wafers included in the processed wafers when the batch-processing by the processing apparatus is completed, and instructing the recycling apparatus to perform recycling processing on the detected non-product wafers based on the recycling processing procedure corresponding to the processing condition that was used when the non-product wafers were processed by the processing apparatus.

When the batch-processing in the processing apparatus is completed, non-product wafers are detected. The recycling apparatus is instructed to perform recycling processing on the detected non-product wafers based on the recycling processing procedure corresponding to the processing condition in the processing apparatus. Thus, the non-product wafers are recycled in the recycling apparatus by an instruction to the recycling apparatus according to the process control method. Even in the case where the recycling processing procedures differ due to the processing conditions in the processing apparatus, the preparation of the non-product wafers prior to the next processing in the processing apparatus can be ensured. As a result, a method of process control in a semiconductor manufacturing system can be provided which can improve the availability ratio of a processing step for processing the product wafers by preparing the non-product wafers with high efficiency and certainty.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram showing diffusion processing database stored in a fixed disk of the server computer.

FIG. 6 is a diagram showing recycling processing database stored in the fixed disk of the server computer.

FIG. 7 is a diagram showing a quantity of wafers within a stocking unit stored in a fixed disk of the server computer.

DESCRIPTION OF THE PREFERRED EMBODIMENT

Figure 1:
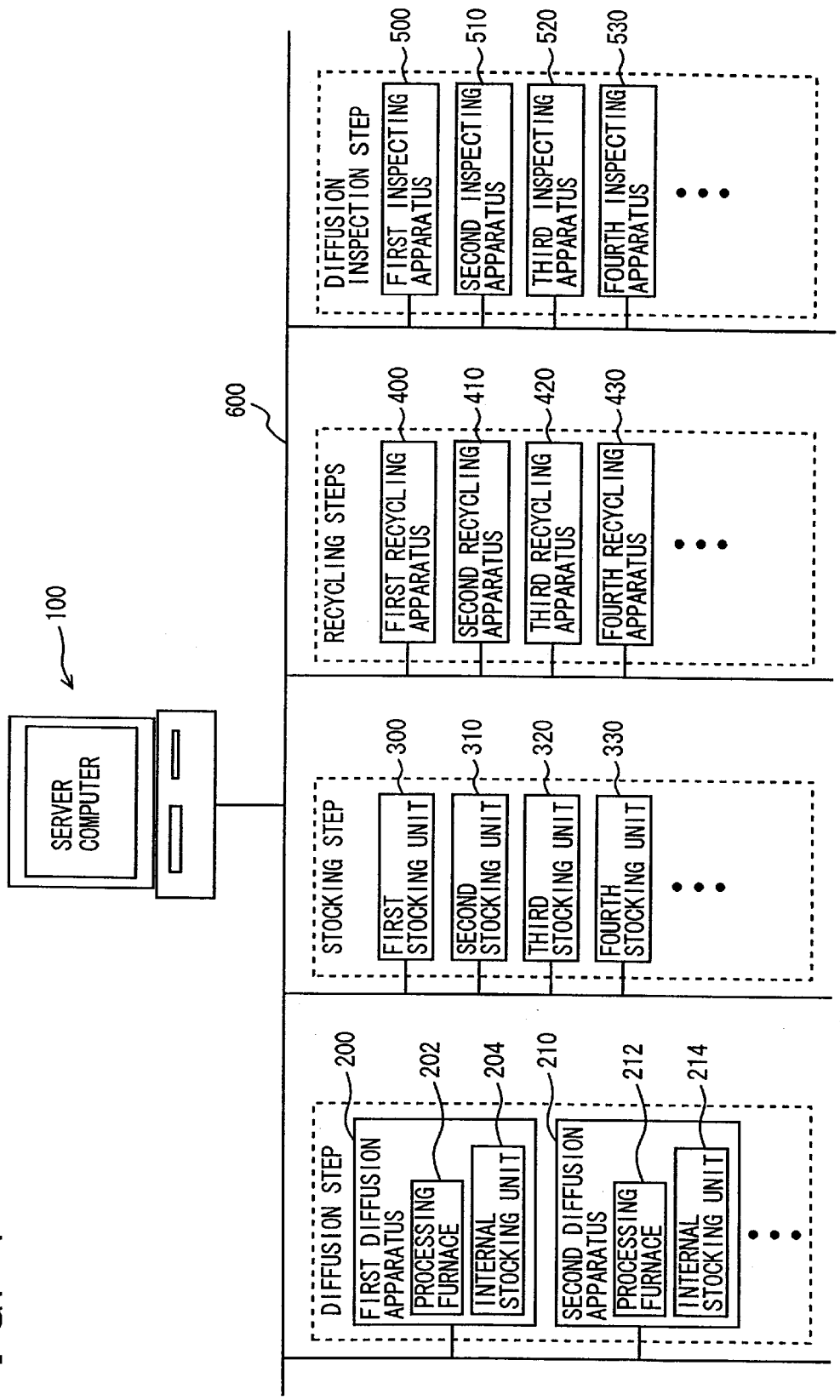
FIG. 1 is a diagram of the overall configuration of a process control system according to an embodiment of the present invention.

The embodiment of the present invention will be described below with reference to the drawings. In the following description and the drawings, the same parts are denoted by the same reference characters. Their names and functions are the same. Thus, the detailed description thereof will not be repeated where appropriate.

Referring to FIG. 1, a process control system according to the present invention includes a plurality of diffusion apparatuses 200, 210, a plurality of stocking units 300 to 330, a plurality of recycling apparatuses 400 to 430, a plurality of inspecting apparatuses 500 to 530, a server computer 100 connected to these apparatuses for controlling the diffusion apparatuses, the stocking units, the recycling apparatuses, and the inspecting apparatuses, and a network such as a LAN (Local Area Network) for connecting these apparatuses with server computer 100.

A plurality of diffusion apparatuses 200, 210 exist in the process control system. The type of a diffusion film to be formed on a wafer (hereinafter, referred to as a film type) is set in advance for each of these diffusion apparatuses. The procedure of recycling processing of a non-product wafer is determined based on the film type that is formed by the diffusion apparatus.

Diffusion apparatus 200 includes a processing furnace 202 and an internal stocking unit 204. Processing furnace 202 batch-processes a prescribed number of wafers based on a predetermined processing condition. At this time, the number of wafers in each of the batches need to be made equal in order to make uniform the temperature distribution and the like within processing furnace 202. For this purpose, when the number of the product wafers is less than the prescribed number, a number of dummy wafers that would fill the prescribed number are set within processing furnace 202. Internal stocking unit 204 stores dummy wafers and monitor wafers that are to be set within processing furnace 202.

In the following description, the control is performed per wafer; yet, the present invention is not so limited. For instance, a plurality of wafers may form one lot, and the control may be performed per lot.

Stocking units 300 include a retrieval stocking unit for storing wafers after diffusion processing and before recycling processing and a stocking unit for storing wafers after recycling processing and before another diffusion processing. The retrieval stocking unit discharges the stored wafers to recycling apparatus 400 based on an instruction from server computer 100. The stocking unit discharges the stored wafers to diffusion apparatus 200 based on an instruction from server computer 100.

Recycling apparatus 400 subjects a non-product wafer to recycling processing based on a recycling procedure corresponding to the processing condition of the diffusion processing (as determined by the film type). Recycling apparatus 400 executes a plurality of processing for recycling processing according to the predetermined procedure. The recycled non-product wafer is stored in the stocking unit.

Inspecting apparatus 500 measures a film thickness and the like after diffusion processing to inspect whether the prescribed processing is being performed.

Server computer 100 communicates with these diffusion apparatuses 200, 210, stocking units 300 to 330, recycling apparatuses 400 to 430, and inspecting apparatuses 500 to 530 to collect information. Server computer 100 implements the process control function of controlling these diffusion apparatuses 200, 210, stocking units 300 to 330, recycling apparatuses 400 to 430, and inspecting apparatuses 500 to 530 based on the collected information.

Figure 2:
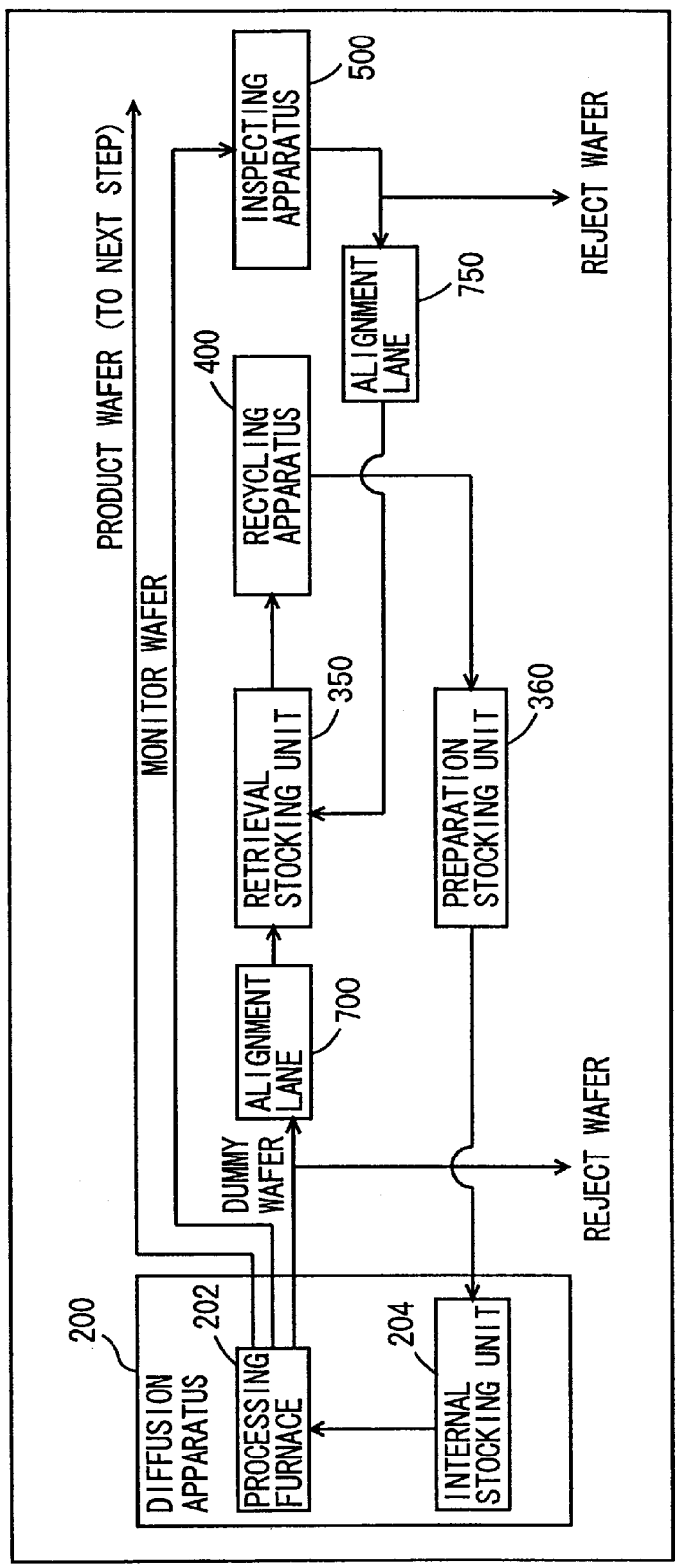
FIG. 2 is a diagram representing transfer of the wafers in a semiconductor manufacturing system.

A transfer path of the wafers in the process control system will be described with reference to FIG. 2. Non-product wafers include dummy wafers to be added to the product wafers of a number smaller than the prescribed number in the batch-processing of the diffusion apparatus and monitor wafers for measuring a film thickness formed in the diffusion apparatus.

The product wafers and the non-product dummy and monitor wafers are processed in diffusion apparatus 200. After diffusion processing, the product wafers that are discharged from processing furnace 202 are transported to the next step.

Reject wafers are separated from among the dummy wafers discharged from processing furnace 202. Wafers having been processed a predetermined number of times in the diffusion step are separated as reject wafers from among the dummy wafers. Dummy wafers that are not reject wafers are stored into a retrieval stocking unit 350 via an alignment lane 700.

Monitor wafers discharged from processing furnace 202 are transported to inspecting apparatus 500. Prescribed measurements of monitor wafers are performed in inspecting apparatus 500. Reject wafers are separated from the measured monitor wafers. The separation at this time is performed in a similar manner to the separation of reject wafers from the dummy wafers described above. Monitor wafers that are not reject wafers are stored into retrieval stocking unit 350 via an alignment lane 750.

On alignment lanes 700 and 750, wafers of the same recycling processing procedure are aligned in one lane. When a lane becomes full, the wafers in the lane are stored into retrieval stocking unit 350. When the non-product wafers accumulates inside retrieval stocking unit 350 to a prescribed number that corresponds to one batch of recycling apparatus 400, and when an accept request from recycling apparatus 400 is received, the prescribed number of wafers are discharged to recycling apparatus 400.

In recycling apparatus 400, processing is performed based on the recycling processing procedure corresponding to the processing condition employed at the time of diffusion processing. When all the processing of the recycling procedure is completed, the non-product wafers are stored into a preparation stocking unit 360. The non-product wafers having undergone recycling processing and stored in preparation stocking unit 360 are transported to internal stocking unit 204 in response to a request from diffusion apparatus 200.

Retrieval stocking unit 350 and preparation stocking unit 360 are assigned from among a first stocking unit 300, a second stocking unit 310, a third stocking unit 320, and a fourth stocking unit 330 in FIG. 1. Moreover, wafers on the alignment lane are in the form of single wafers or in the form of a plurality of wafers being stored in a carrier. Wafers in the stocking unit are in the form of single wafers or in the form of a plurality of wafers being stored in a carrier. The number of wafers to be stored in the carrier is determined based on the size, the weight and such of the wafer.

The process control function in the process control system according to the present embodiment is implemented by having a CPU (Central Processing Unit) execute a prescribed program on a computer.

Figure 3:
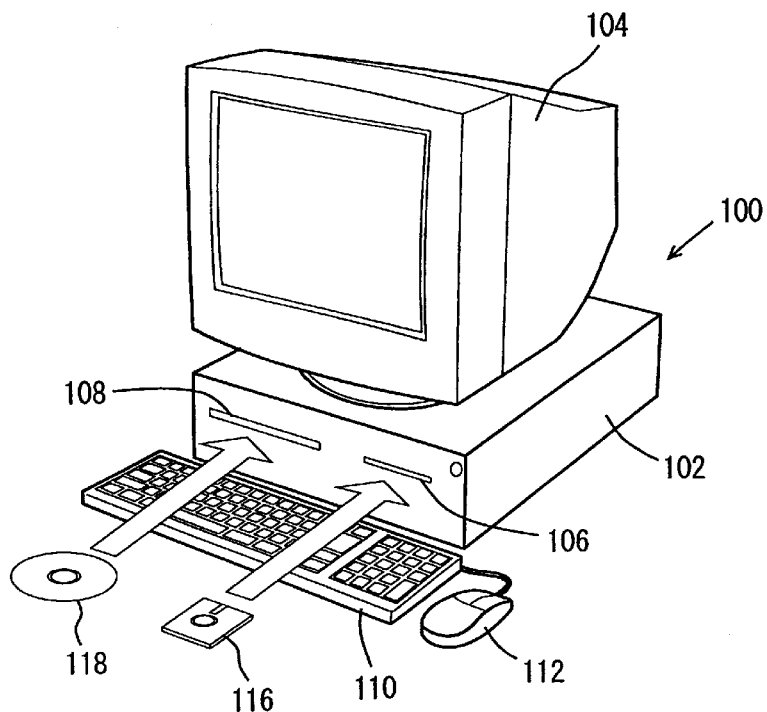
FIG. 3 is an external view of a computer that implements a server computer.

FIG. 3 shows an external view of a computer system which is an example of server computer 100 that implements the process control function. Referring to FIG. 3, the computer system includes a computer 102 provided with an FD (Flexible Disk) drive 106 and a CD-ROM (Compact Disc-Read Only Memory) drive 108, a monitor 104, a keyboard 110, and a mouse 112.

Figure 4:
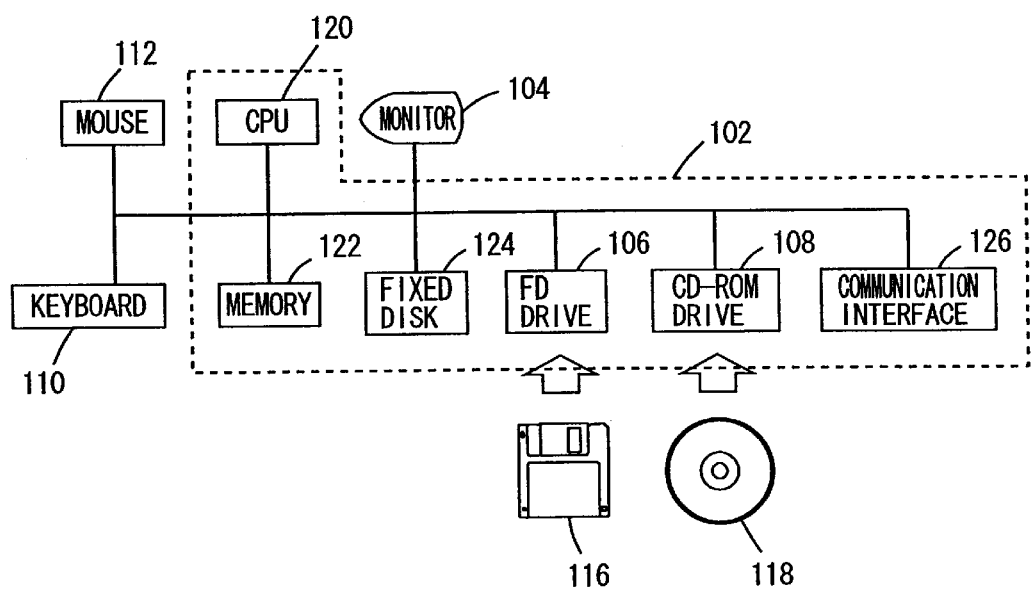
FIG. 4 is a control block diagram of a computer.

FIG. 4 shows a configuration of the computer system in a form of the block diagram. As shown in FIG. 4, in addition to the above-described FD drive 106 and CD-ROM drive 108, computer 102 includes a CPU 120, a memory 122, a fixed disk 124, and a communication interface 126 for communicating with another computer, which are interconnected using buses. An FD 116 is set in FD drive 106. A CD-ROM 118 is set in CD-ROM drive 108. Prescribed programs are stored in these FD 116 and CD-ROM 118.

As already described, the process control function in server computer 100 is implemented by computer hardware and software implemented by a program executed by CPU 120. In general, such a program is stored and distributed in a record medium such as FD 116 and CD-ROM 118, and is read from the record medium by FD drive 106 or CD-ROM drive 108 and stored temporarily in fixed disk 124. Further, the program is read from fixed disk 124 into memory 122 and is executed by CPU 120.

In such a computer, the hardware per se is of a general type. The computer includes a control circuit including a CPU, a storage circuit, an input circuit, an output circuit, and an OS (Operating System), and is provided with an environment for executing the program. The present invention utilizes such a computer to implement the process control function.

The operation of the computer itself shown in FIGS. 3 and 4 is well known so that the detailed description thereof will not be repeated.

Diffusion processing database stored in fixed disk 124 of server computer 100 according to the present embodiment will be described with reference to FIG. 5. As shown in FIG. 5, for each diffusion apparatus, the type of diffusion processing performed by the diffusion apparatus, and the type of dummy wafers and the type of monitor wafers to be used in the diffusion apparatus are stored in the diffusion processing database. For instance, an "oxide film treatment" is performed in the first to fifth diffusion apparatuses, and the type of dummy wafers to be used in these diffusion processing is "A1," while the type of monitor wafers to be used is "A2." Besides "oxide film treatment," other types of diffusion processing include a "nitride film treatment," an "H2 sinter treatment," and the like. For each diffusion apparatus, the type of diffusion processing by which to form a diffusion film on a wafer and the type of dummy wafers and the type of monitor wafers to be used are determined.

Recycling processing database stored in fixed disk 124 will be described with reference to FIG. 6. As shown in FIG. 6, for each type of dummy wafer and for each type of monitor wafer, a procedure of recycling steps are stored in the recycling processing database. For each of dummy wafer types "A1," "B1," and "C1," a procedure of recycling steps is stored. In addition, for each of monitor wafer types "A2," "B2," and "C2," a procedure of recycling steps is stored. For instance, if the type of dummy wafer is "A1," then the recycling steps involve the procedure of "'step A'→'step B'→'step C'→'step D.'" The dummy wafer "A1" is recycled through these recycling steps.

Data of the quantity of wafers within a stocking unit stored in fixed disk 124 will be described with reference to FIG. 7. As shown in FIG. 7, data of the quantity of wafers within a stocking unit are stored separately for retrieval stocking unit 350 and preparation stocking unit 360. The quantities of wafers in each of the stocking units are stored for each type of wafers. Let us assume that retrieval stocking unit 350 has stocking units "S1," "S2," and "S3," and preparation stocking unit 360 has stocking units "T1," "T2," and "T3." For instance, the fact that 5 dummy wafers "B1" and 20 monitor wafers "B2" are stored in retrieval stocking unit "S2" is stored, and the fact that 70 dummy wafers "C1" and 10 monitor wafers "C2" are stored in preparation stocking unit "T3" is stored. As described above, retrieval stocking unit 350 is for storing wafers prior to introduction into recycling apparatus 400, and preparation stocking unit 360 is for storing wafers after they are recycled by recycling apparatus 400.

Figure 8:
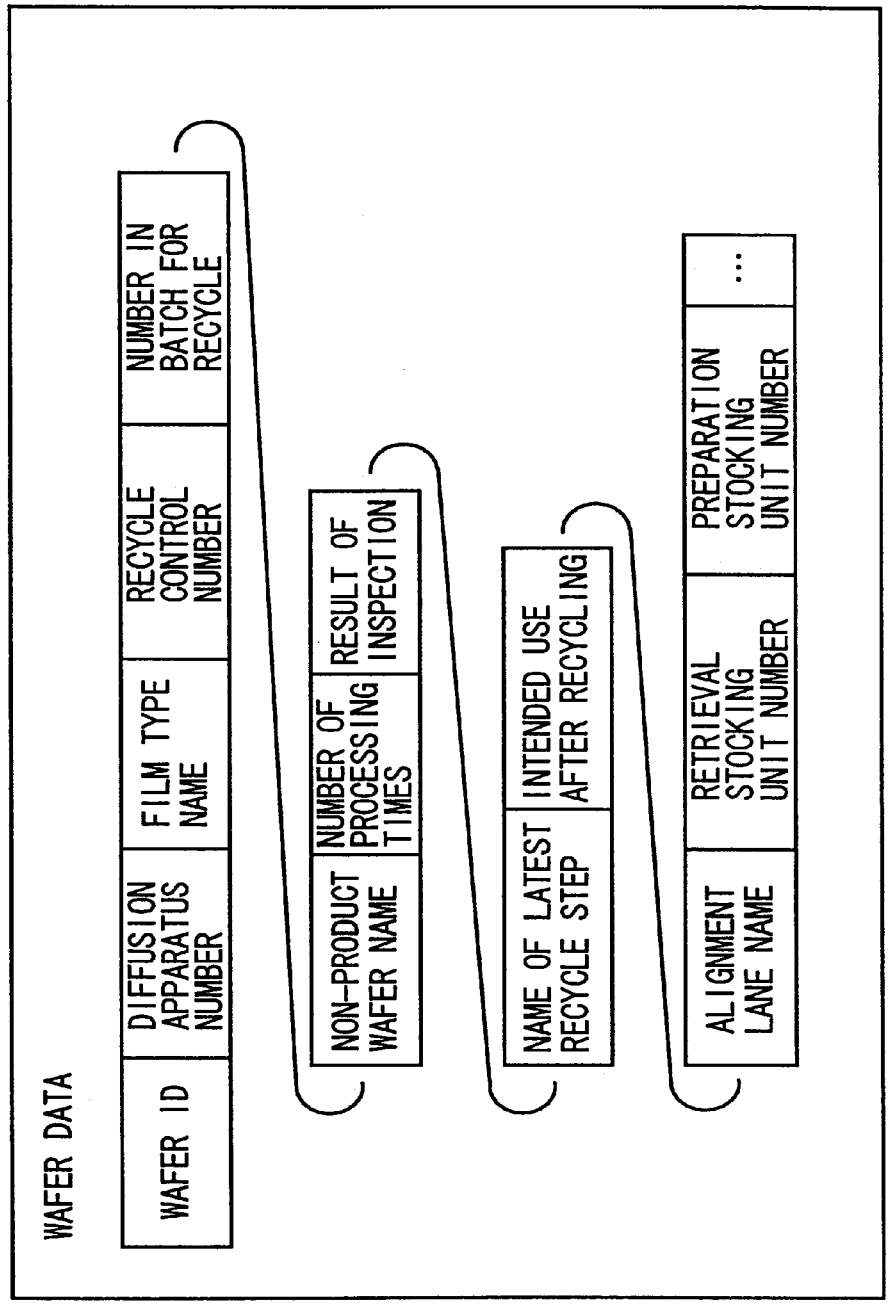
FIG. 8 is a diagram showing wafer data that is communicated between the server computer and each apparatus.

Wafer data stored for each wafer will be described with reference to FIG. 8. As shown in FIG. 8, wafer data includes a wafer ID for identifying a non-product wafer, a diffusion apparatus number, a film type name, a recycle control number, a number in a batch for recycle, a non-product wafer name, a number of processing times, a result of inspection, a name of latest recycle step, an intended use after recycling, an alignment lane name, a retrieval stocking unit number, and a preparation stocking unit number.

The diffusion apparatus number is the number for a diffusion apparatus with which a wafer specified by the wafer ID is subjected to diffusion processing. The film type name is the name for the type of film that is formed on the wafer in the diffusion apparatus. The recycle control number represents the control number for recycling processing in a recycling apparatus. The number in a batch for recycle indicates the number of wafers per one batch upon recycling in the recycling apparatus.

The non-product wafer name indicates whether the wafer is a dummy wafer or a monitor wafer. Dummy wafers may include further subdivided types (for example, side dummy and extra dummy). The number of processing times indicates the number of times the wafer has undergone diffusion processing. Moreover, the number of processing times may store the number of times the wafer has undergone recycling processing. The result of inspection is stored when the non-product wafer name is monitor wafer. The name of latest recycle step represents the name of the latest step of processing in the procedure of recycling steps shown in FIG. 6. The intended use after recycling represents the purpose for which the wafer will be used after recycling processing (the distinction between dummy wafer and monitor wafer).

The alignment lane name represents the name of a lane in alignment lanes 700 and 750 on which wafers are aligned. The retrieval stocking unit number indicates the number for a retrieval stocking unit 350. The preparation stocking unit number indicates the number for a preparation stocking unit 360. In addition, when the stocking unit is composed of multiple shelves, the retrieval stocking unit number and the preparation stocking unit number may also store a shelf number of the stocking unit.

Figure 9:
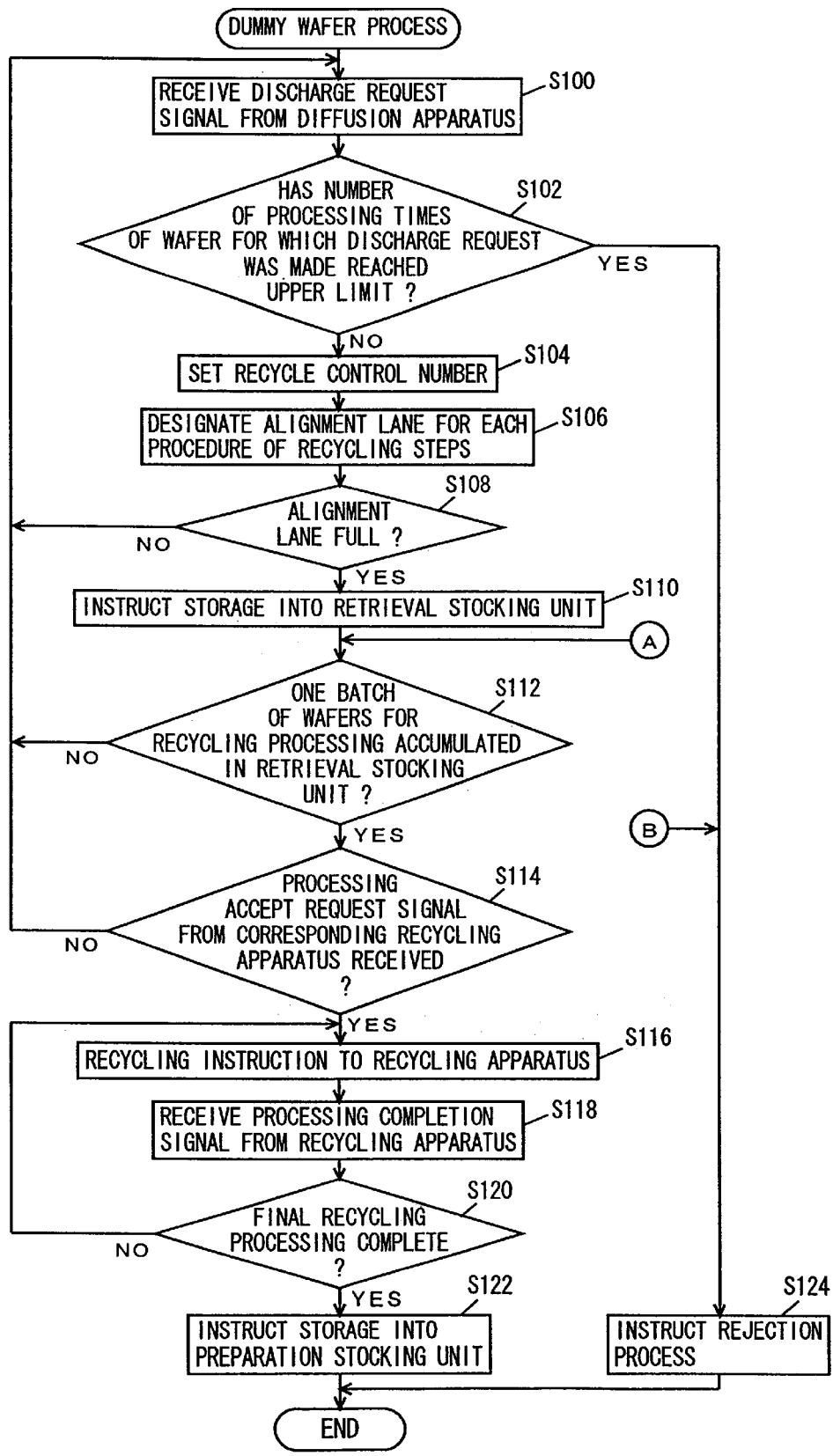
FIG. 9 is a flow chart representing dummy wafer process in the server computer according to the embodiment of the present invention.

Referring to FIG. 9, a program executed in server computer 100 according to the present embodiment has the following control structure with respect to the dummy wafer process.

In a step (hereinafter, abbreviated as "S") 100, CPU 120 receives a discharge request signal from diffusion apparatus 200. At this time, server computer 100 receives a wafer ID for specifying the wafer to be discharged from diffusion apparatus 200.

In S102, CPU 120 determines whether the number of processing times of the wafer for which the discharge request was made has reached the upper limit. This determination is performed based on the wafer ID received in S100, the wafer data (FIG. 8) stored in fixed disk 124, and the upper limit of the number of processing times. In addition, the upper limit of the number of processing times is predetermined and stored in fixed disk 124 in advance. If the number of processing times of the wafer for which the discharge request was made has reached the upper limit (YES at S102), then the process moves to S124. If not (NO at S102), then the process moves to S104.

In S104, CPU 120 sets the recycle control number. At this time, CPU 120 specifies the dummy wafer type or the monitor wafer type and specifies the procedure of recycling steps based on the diffusion apparatus number and the non-product wafer name stored in the wafer data (FIG. 8).

In S106, CPU 120 designates an alignment lane for each procedure of recycling steps. The designated alignment lane is stored as an alignment lane name of the wafer data (FIG. 8).

In S108, CPU 120 determines whether the alignment lane has become full. This determination is performed by receiving a full lane signal from the alignment lane. If the alignment lane has become full (YES at S108), then the process moves to S110. If not (NO at S108), then the process returns to S100, and further waits for a discharge request from diffusion apparatus 200.

In S110, CPU 120 instructs storage of the wafers arranged on the alignment lane that has become full into a retrieval stocking unit. In S112, CPU 120 determines whether one batch of wafers for the recycling processing has accumulated in the retrieval stocking unit. This determination is performed based on the number in a batch for recycle. If one batch of wafers for the recycling processing has accumulated in the retrieval stocking unit (YES at S112), then the process moves to S114. If not (NO at S112), then the process returns to S100.

In S114, CPU 120 determines whether a processing accept request signal from the corresponding recycling apparatus has been received. At this time, the recycling apparatus performs recycling processing of the non-product wafers in parallel with processing of the product wafers. The recycling apparatus processes the product wafers and the non-product wafers in separate batches. The recycling apparatus speedily sends the processing accept request for recycling processing according to a schedule planned out including both the product wafers and the non-product wafers. If the processing accept request signal is received from the corresponding recycling apparatus (YES at S114), then the process moves to S116. If not (NO at S114), then the process returns to S100.

In S116, CPU 120 instructs the recycling processing to the recycling apparatus. In S118, CPU 120 receives a processing completion signal from the recycling apparatus. Every time a processing completion signal is received, the name of latest recycle step in the wafer data (FIG. 8) is updated.

In S120, CPU 120 determines whether the final recycling processing has been completed. This determination is performed based on the name of latest recycle step in the wafer data (FIG. 8) and the procedure of recycling steps in the recycling processing database (FIG. 6). If the final recycling processing has been completed (YES at S120), then the process moves to S122. If not (NO at S120), then the process returns to S116, and further recycling processing would be performed. In S122, CPU 120 instructs storage of the wafer into preparation stocking unit 360.

In S124, CPU 120 instructs rejection process when the number of processing times of the wafer that is discharged from the diffusion apparatus has reached the upper limit. For instance, this instruction is output to a controller that controls the branching of a conveyor that transports the monitor wafers (branching into wafers to be recycled and wafers to be rejected).

Figure 10:
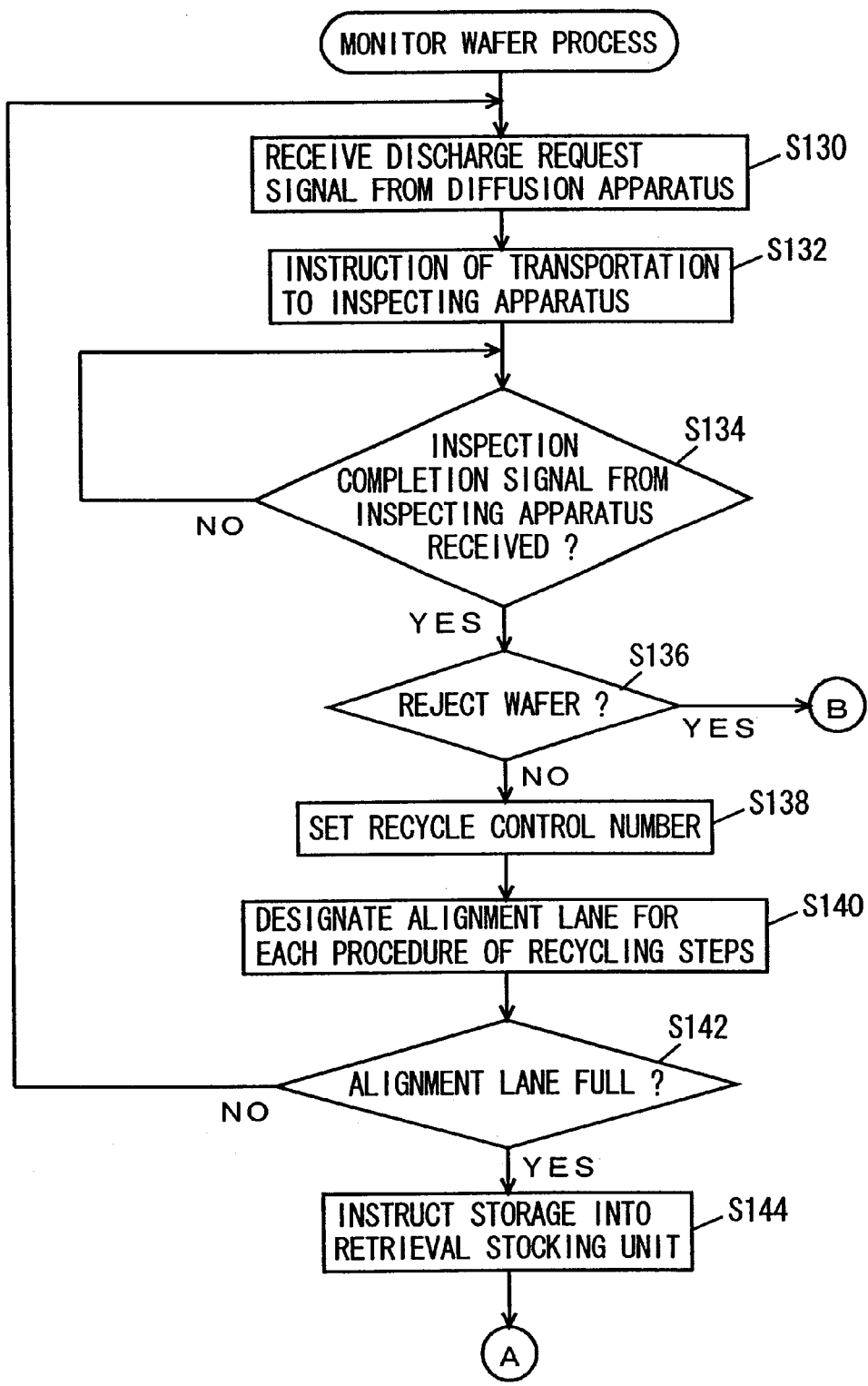
FIG. 10 is a flow chart representing monitor wafer process in the server computer according to the embodiment of the present invention.

Referring to FIG. 10, a program executed in server computer 100 according to the present embodiment has the following control structure with respect to the monitor wafer process.

In S130, CPU 120 receives a discharge request signal from diffusion apparatus 200. At this time, server computer 100 receives a wafer ID that specifies the wafer to be discharged from diffusion apparatus 200.

In S132, CPU 120 instructs transportation of the wafer specified by the wafer ID received to an inspecting apparatus. In S134, CPU 120 determines whether an inspection completion signal from the inspecting apparatus has been received. If the inspection completion signal is received from the inspecting apparatus (YES at S134), then the process moves to S136. If not (NO at S134), then the process returns to S130, and waits until the inspection completion signal is received from the inspecting apparatus.

In S136, CPU 120 determines whether the monitor wafer is a reject wafer. This determination, like the processing in S102 described above, is performed based on the number of processing times of the wafer and the upper limit of the number of processing times predetermined. If the monitor wafer is a reject wafer (YES at S136), then the process moves to S124 (FIG. 9). If not (NO at S136), then the process moves to S138.

In S138, CPU 120 sets the recycle control number. In S140, CPU 120 designates an alignment lane for each procedure of recycling steps. In S142, CPU 120 determines whether the alignment lane has become full. At this time, the alignment lane that is determined as being full or not is alignment lane 750 disposed between inspecting apparatus 500 and retrieval stocking unit 350.

If the alignment lane has become full (YES at S142), then the process moves to S144. If not (NO at S142), then the process returns to S130.

In S144, CPU 120 instructs storage into retrieval stocking unit 350. Thereafter, the process moves to S112 (FIG. 9).

Figure 11:
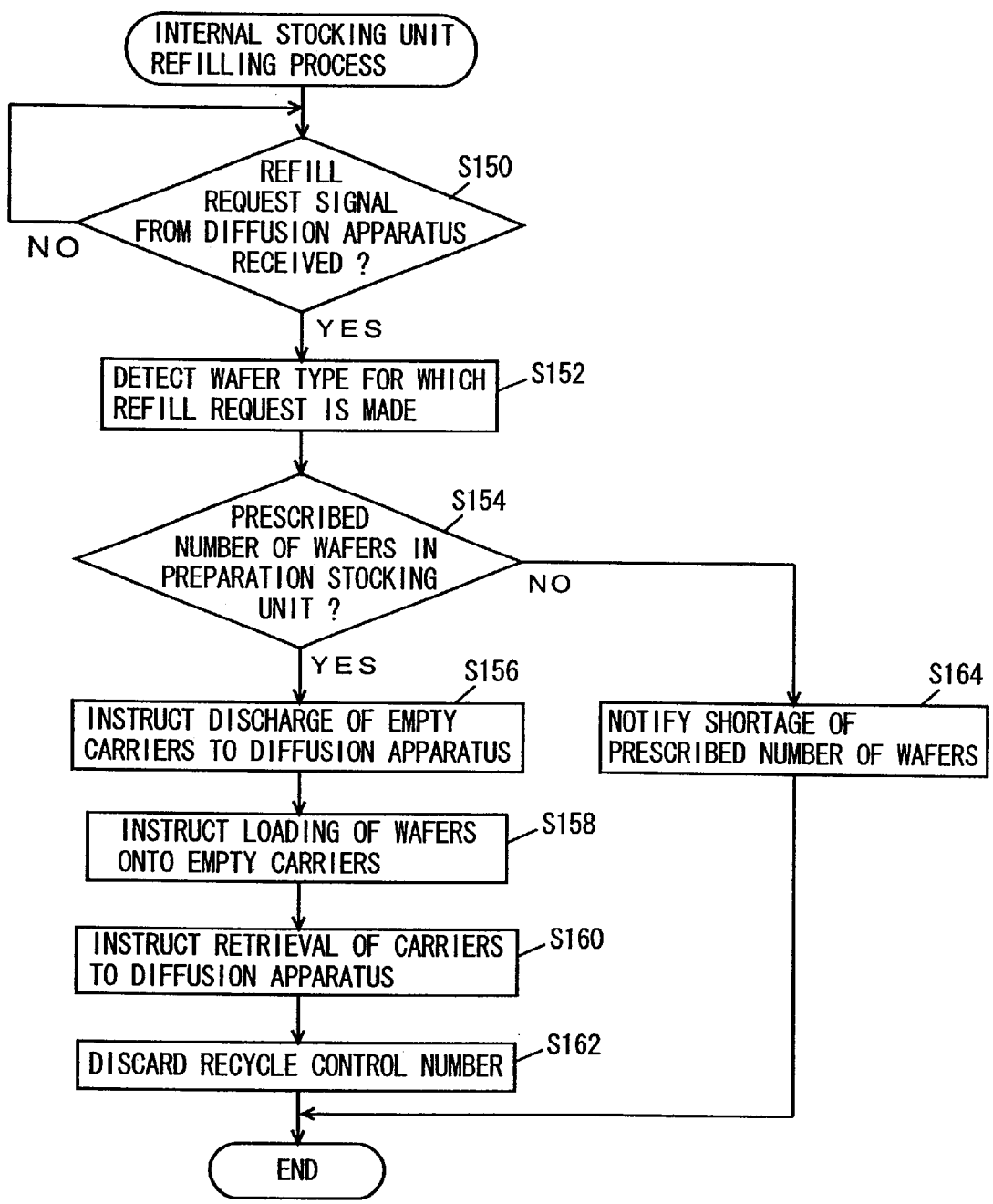
FIG. 11 is a flow chart representing internal stocking unit refilling process in the server computer according to the embodiment of the present invention.

Referring to FIG. 11, a program executed in server computer 100 according to the present embodiment has the following control structure with respect to internal stocking unit refilling process.

In S150, CPU 120 determines whether a refill request signal from diffusion apparatus 200 has been received. At this time, server computer 100 receives data including the number for the diffusion apparatus, the type of non-product wafer for which the refill request has been made (dummy wafer or monitor wafer), and number of wafers that are requested to be refilled. If the refill request signal is received from diffusion apparatus 200 (YES at S150), then the process moves to S152. If not (NO at S150), then the process returns to S150, and waits until a refill request from diffusion apparatus 200 is received.

In S152, CPU 120 detects the wafer type for which the refill request is made. In this process, the type of dummy wafer or the type of monitor wafer is detected based on the number for the diffusion apparatus that has sent the refill request and the type of non-product wafer received in S150 and on the diffusion processing database (FIG. 5).

In S154, CPU 120 determines whether a prescribed number of wafers are stocked in preparation stocking unit 360. This determination is performed based on data of a quantity of wafers within a stocking unit (FIG. 7). If the prescribed number of wafers are in the stocking unit (YES at S154), then the process moves to S156. If not (NO at S154), the process moves to S164.

In S156, CPU 120 instructs discharge of empty carriers to diffusion apparatus 200. Due to this instruction, diffusion apparatus 200 discharges the empty carriers stored in internal stocking unit 204 to the outside of diffusion apparatus 200.

In S158, CPU 120 instructs loading of wafers onto the discharged empty carriers. In S160, CPU 120 instructs diffusion apparatus 200 to retrieve the carriers. Due to this instruction, diffusion apparatus 200 retrieves the carriers loaded with wafers into internal stocking unit 204. In S162, CPU 120 discards the recycle control number.

In S164, if the prescribed number of wafers are not in preparation stocking unit 360, CPU 120 notifies to the operator that there are not enough wafers.

An operation of server computer 100 that implements the process control function based on the structures and flow charts described above will be described.

When product wafers and non-product wafers (dummy wafers and monitor wafers) are processed in a diffusion apparatus 200, a discharge request signal is sent from diffusion apparatus 200 to server computer 100 (S100). If the number of processing times of a dummy wafer for which the discharge request was made has reached the upper limit (YES at S102), then the dummy wafer is subjected to rejection process (S124). If the number of processing times of the dummy wafer has not reached the upper limit (NO at S102), then the recycle control number is set (S104).

The recycle control number is stored in the wafer data (FIG. 8). An alignment lane is designated for each procedure of recycling steps (S106). Dummy wafers are aligned on the designated alignment lane, and when the alignment lane becomes full (YES at S108), the storage into retrieval stocking unit 350 is instructed (S110).

The transport is instructed of a monitor wafer discharged from diffusion apparatus 200 to the inspecting apparatus (S132). According to this instruction, a monitor wafer is transported to inspecting apparatus 500, and prescribed inspection is performed. When an inspection completion signal is received from the inspecting apparatus (YES at S134), it is determined whether the monitor wafer is a reject wafer. If the monitor wafer is not a reject wafer (NO at S136), then the recycle control number is set (S138).

A lane of alignment lane 750 is designated for each procedure of recycling steps (S140). When the lane of alignment lane 750 becomes full (YES at S142), the storage of the wafers into retrieval stocking unit 350 is instructed (S144). Due to this instruction, the monitor wafer is stored in retrieval stocking unit 350.

In this manner, the dummy wafers and the monitor wafers are stored in retrieval stocking unit 350. When the number of wafers that equals one batch of wafers for the recycling processing has accumulated within retrieval stocking unit 350 (YES at S112), it is determined whether a processing accept request signal from the corresponding recycling apparatus 400 has been received (S114).

When the processing accept request signal is received from recycling apparatus 400 (YES at S114), a recycling instruction is given to recycling apparatus 400 (S116). In recycling apparatus 400, the recycling processing is performed according to the prescribed recycling procedure until the final recycling processing is completed (YES at S120). For wafers whose final recycling processing has been completed, storage into preparation stocking unit 360 is instructed (S122). Thus, dummy wafers and monitor wafers whose recycling processing are completed are stored into preparation stocking unit 360. When a wafer is stored into preparation stocking unit 360, data of the quantity of wafers within a stocking unit (FIG. 7) is updated.

In order to prepare the next batch, diffusion apparatus 200 inquires of internal stocking unit 204 about the number of dummy wafers and the number of monitor wafers. When dummy wafers or monitor wafers necessary for the next processing do not exist in internal stocking unit 204, diffusion apparatus 200 sends a refill request to server computer 100. When server computer 100 receives the refill request signal from the diffusion apparatus (YES at S150), server computer 100 detects the wafer type for which the refill request is made (S152). When a prescribed number of wafers exist in preparation stocking unit 360 (YES at S154), the discharge of empty carriers is instructed to the diffusion apparatus (S156).

The instruction to load the wafers onto the empty carriers is given (S158), and wafers of a predetermined loading number (dummy wafers or monitor wafers) are loaded to the empty carriers. When the diffusion apparatus is instructed to retrieve the carriers (S160), the carriers having the prescribed number of wafers loaded thereto are retrieved into internal stocking unit 204 of the diffusion apparatus.

The recycle control number corresponding to the wafer loaded in the carrier is discarded (S162), and the recycling processing is completed. In addition, when the prescribed number of wafers are not in preparation stocking unit 360, the operator is notified that not enough wafers exist (S164).

In the above-described manner, the process control apparatus according to the present embodiment sets recycle control numbers for the non-product dummy wafers and monitor wafers after the diffusion processing in the diffusion apparatus is completed. The recycle control number is set so as to control the procedure of recycling steps determined by the film type and the type of the non-product wafer. When wafers by the unit of a batch for recycling processing are collected and when a processing accept request is received from the corresponding recycling apparatus, a recycling instruction is given to the recycling apparatus. When the final recycling processing is completed, the non-product wafers (dummy wafers and monitor wafers) whose final recycling processing is completed are stored into a preparation stocking unit. The non-product wafers stored into the preparation stocking unit are supplied into an internal stocking unit of the diffusion apparatus when a discharge request from the diffusion apparatus is received, and the recycle control numbers are discarded. Consequently, the process control apparatus provides an instruction to the recycling apparatus, and according to this instruction, the non-product wafers are recycled by the recycling apparatus. Even in the case where the recycling processing procedure differs due to the film type in the diffusion apparatus, the preparation of the non-product wafers prior to the next diffusion processing in the diffusion apparatus can be ensured. As a result, the availability ratio of the diffusion apparatus for subjecting the product wafers to diffusion processing can be improved by preparing the non-product wafers with high efficiency and certainty.

In the above description, it is assumed that the semiconductor manufacturing system includes an alignment lane; yet, the present invention is not so limited. Instead of arranging the carriers with the wafers stored therein onto the alignment lane, the wafers may be taken directly from the diffusion apparatus to be stored in a retrieval stocking unit, or taken from the recycling apparatus to be stored in a stocking unit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A process control apparatus for controlling a semiconductor manufacturing system including a processing apparatus for batch-processing a prescribed number of wafers at once and a recycling apparatus for recycling wafers processed by said processing apparatus, wherein said processing apparatus processes said wafers based on a predetermined processing condition, and said prescribed number of wafers include product wafers and non-product wafers, and said recycling apparatus recycles said non-product wafers, and the recycled wafers are repeatedly processed by said processing apparatus, said process control apparatus comprising:
a communication circuit for communicating with said processing apparatus and said recycling apparatus;
a storage circuit for storing recycling processing procedure corresponding to said processing condition;
a detection circuit connected to said communication circuit for detecting non-product wafers included in the processed wafers when the batch-processing by said processing apparatus is completed; and
an instructing circuit connected to said communication circuit, said storage circuit, and said detection circuit for instructing said recycling apparatus to perform recycling processing on the detected non-product wafers based on the recycling processing procedure corresponding to the processing condition that was used when said non-product wafers were processed by said processing apparatus.

2. The process control apparatus according to claim 1, further comprising:
a counting circuit for counting a number of times said non-product wafers are processed by said processing apparatus; and
a control circuit connected to said detection circuit and said counting circuit for controlling said instructing circuit to interrupt said instruction when a number of times the detected non-product wafers are processed exceeds a predetermined number of times.

3. The process control apparatus according to claim 1, wherein
said processing apparatus is a diffusion apparatus, and said processing condition is determined for each type of film generated on the wafers in said diffusion apparatus.

4. The process control apparatus according to claim 1, wherein
said processing apparatus is a diffusion apparatus, and said non-product wafers include dummy wafers for filling a number of wafers processed in said diffusion apparatus to said prescribed number and monitor wafers for inspecting a result of processing by said diffusion apparatus.

5. The process control apparatus according to claim 1, wherein
said recycling apparatus batch-processes a prescribed number of wafers at once, said semiconductor manufacturing system further includes a stocking unit disposed between said processing apparatus and said recycling apparatus, and said stocking unit stocks a prescribed number of wafers required for processing in said recycling apparatus, and
said communication circuit includes a circuit for communicating with said stocking unit as well as with said processing apparatus and said recycling apparatus,
said process control apparatus further comprising:
a stocking unit control circuit connected to said communication circuit for controlling said stocking unit to discharge said non-product wafers to said recycling apparatus from said stocking unit when a prescribed number of the non-product wafers required for processing in said recycling apparatus are stocked.

6. The process control apparatus according to claim 5, further comprising:
a reception circuit connected to said communication circuit for receiving an accept request from said recycling apparatus, wherein
said stocking unit control circuit includes a circuit for controlling said stocking unit to discharge said non-product wafers to said recycling apparatus from said stocking unit when the prescribed number of non-product wafer required for processing in said recycling apparatus are stocked and when said reception circuit receives said accept request from said recycling apparatus.

7. A process control apparatus for controlling a semiconductor manufacturing system including a processing apparatus for batch-processing a prescribed number of wafers at once and a recycling apparatus for recycling wafers processed by said processing apparatus, wherein said processing apparatus processes said wafers based on a predetermined processing condition, and said prescribed number of wafers include product wafers and non-product wafers, and said recycling apparatus recycles said non-product wafers, and the recycled wafers are repeatedly processed by said processing apparatus, said process control apparatus comprising:
communication means for communicating with said processing apparatus and said recycling apparatus;
storage means for storing recycling processing procedure corresponding to said processing condition;
detection means connected to said communication means for detecting non-product wafers included in the processed wafers when the batch-processing by said processing apparatus is completed; and
instructing means connected to said communication means, said storage means, and said detection means for instructing said recycling apparatus to perform recycling processing on the detected non-product wafers based on the recycling processing procedure corresponding to the processing condition used when said non-product wafers were processed by said processing apparatus.

8. The process control apparatus according to claim 7, further comprising:

counting means for counting a number of times said non-product wafers are processed by said processing apparatus; and control means connected to said detection means and said counting means for controlling said instructing means to interrupt said instruction when a number of times the detected non-product wafers are processed exceeds a predetermined number of times.

9. The process control apparatus according to claim 7, wherein said processing apparatus is a diffusion apparatus, and said processing condition is determined for each type of film generated on the wafers in said diffusion apparatus.

10. The process control apparatus according to claim 7, wherein said processing apparatus is a diffusion apparatus, and said non-product wafers include dummy wafers for filling a number of wafers processed in said diffusion apparatus to said prescribed number and monitor wafers for inspecting a result of processing by said diffusion apparatus.

11. The process control apparatus according to claim 7, wherein said recycling apparatus batch-processes a prescribed number of wafers at once, said semiconductor manufacturing system further includes a stocking unit disposed between said processing apparatus and said recycling apparatus, and said stocking unit stocks a prescribed number of wafers required for processing in said recycling apparatus, and said communication means includes means for communicating with said stocking unit as well as with said processing apparatus and said recycling apparatus, said process control apparatus further comprising:

stocking unit control means connected to said communication means for controlling said stocking unit to discharge said non-product wafers to said recycling apparatus from said stocking unit when a prescribed number of the non-product wafers required for processing in said recycling apparatus are stocked.

12. The process control apparatus according to claim 11, further comprising:

reception means connected to said communication means for receiving an accept request from said recycling apparatus, wherein said stocking unit control means includes means for controlling said stocking unit to discharge said non-product wafers to said recycling apparatus from said stocking unit when the prescribed number of non-product wafer required for processing in said recycling apparatus are stocked and when said reception means receives said accept request from said recycling apparatus.

* * * * *